(12) United States Patent
Lee et al.

(10) Patent No.: US 12,739,536 B2
(45) Date of Patent: Sep. 15, 2026

(54) SYSTEM AND METHOD FOR ENHANCING PARASITIC LIGHT SENSITIVITY OF IMAGE SENSOR

(71) Applicant: SEMICONDUCTOR COMPONENTS INDUSTRIES, LLC, Scottsdale, AZ (US)

(72) Inventors: Byounghee Lee, Boise, ID (US); Andrew Eugene Perkins, Boise, ID (US)

(73) Assignee: SEMICONDUCTOR COMPONENTS INDUSTRIES, LLC, Scottsdale, AZ (US)

( * ) Notice: Subject to any disclaimer, the term of this patent is extended or adjusted under 35 U.S.C. 154(b) by 66 days.

(21) Appl. No.: 18/936,005

(22) Filed: Nov. 4, 2024

(65) Prior Publication Data

US 2026/0129319 A1 May 7, 2026

(51) Int. Cl.

| | |
|---|---|
| ***H04N 25/78*** | (2023.01) |
| ***H04N 25/531*** | (2023.01) |
| ***H04N 25/62*** | (2023.01) |
| ***H10F 39/00*** | (2025.01) |
| ***H10F 39/12*** | (2025.01) |

(52) U.S. Cl.
CPC ........... *H04N 25/78* (2023.01); *H04N 25/531* (2023.01); *H04N 25/62* (2023.01); *H10F 39/199* (2025.01); *H10F 39/805* (2025.01); *H10F 39/806* (2025.01)

(58) Field of Classification Search
CPC ...... H04N 25/78; H04N 25/531; H04N 25/62; H10F 39/199; H10F 39/805; H10F 39/806
See application file for complete search history.

(56) References Cited

U.S. PATENT DOCUMENTS

| | | | |
|---|---|---|---|
| 12,541,113 B2 * | 2/2026 | Lee | G02B 27/1013 |
| 2018/0045953 A1 | 2/2018 | Fan et al. | |
| 2019/0196068 A1 | 6/2019 | Tsai et al. | |
| 2021/0372856 A1 | 12/2021 | Kim et al. | |
| 2024/0363661 A1 * | 10/2024 | Jiang | G02B 3/08 |

FOREIGN PATENT DOCUMENTS

| | | |
|---|---|---|
| KR | 20210146785 A | 12/2021 |

OTHER PUBLICATIONS

Sergey Velichko, "Overview of CMOS Global Shutter Pixels" IEEE Transactions on Electron Devices, vol. 69, No. 6, Jun. 2022, 9 pages.

Chun-Yuan Wang et al., "CMOS Image Sensor with Nano Light Pillars for Optical Performance Enhancement" VisEra Technologies Company, No. 12, Dusing Rd.1, Hsinchu Science Park, Taiwan (30078), 979-8-3503-2767-0/23/ © 2023 IEEE, 4 pages.

* cited by examiner

*Primary Examiner* — Ahmed A Berhan
(74) *Attorney, Agent, or Firm* — Slayden Grubert Beard PLLC

(57) ABSTRACT

An image sensor is disclosed. The image sensor includes a plurality of image pixels. Each image pixel includes a semiconductor region having a photodiode and a light-sensitive electrical element. Each image pixel further includes a primary metalens. The primary metalens includes a dielectric layer and a plurality of nanostructures arranged within the dielectric layer. Each of the plurality of nanostructures has a first refractive index that is greater than a second refractive index of the dielectric layer. The plurality of nanostructures is patterned within the dielectric layer to direct light received by the image pixel away from the light-sensitive electrical element.

20 Claims, 11 Drawing Sheets

SYSTEM AND METHOD FOR ENHANCING PARASITIC LIGHT SENSITIVITY OF IMAGE SENSOR

TECHNICAL FIELD

The disclosure relates generally to image sensors, and particularly to techniques for improving parasitic light sensitivity of image sensors.

BACKGROUND

Image sensors are used in electronic devices such as cellular telephones, cameras, and computers to capture images. An electronic device may be provided with an image sensor including an array of image pixels arranged in a grid pattern. Each image pixel may receive photons, such as light, and may convert the photons into electrical signals.

The inventors of embodiments of the present disclosure have recognized that image pixels may include structures that are sensitive to parasitic light. The inventors of embodiments of the present disclosure have further recognized that the sensitivity of image pixel structures to parasitic light may affect the parasitic light sensitivity of the image sensor as a whole. Embodiments of the present disclosure may address one or more of these challenges.

BRIEF DESCRIPTION OF THE DRAWINGS

A more complete understanding of the present embodiments may be acquired by referring to the following description taken in conjunction with the accompanying drawings, in which like reference numbers indicate like features.

DETAILED DESCRIPTION

Details of one or more embodiments are set forth in the description below and the accompanying drawings. Other features will be apparent from the description, drawings, and from the claims. Although one or more of these embodiments may be preferred, the embodiments disclosed should not be interpreted, or otherwise used, as limiting the scope of the disclosure, including the claims. In addition, one skilled in the art understands that the following description has broad application, and the discussion of any embodiment is meant only to be exemplary of that embodiment, and not intended to intimate that the scope of the disclosure, including the claims, is limited to that embodiment.

Various terms are used to refer to particular system components. Different companies may refer to a component by different names, and this disclosure does not intend to distinguish between components that differ in name but not form and function. In the following discussion and in the claims, the terms “including” and “comprising” are used in an open-ended fashion, and thus should be interpreted to mean “including, but not limited to.” Also, the term “couple” or “coupled” is intended to mean either an indirect or direct connection. Thus, if a first device couples to a second device, that connection may be through a direct connection or through an indirect connection via other devices and connections.

Terms defining an elevation, such as “above,” “below,” “upper,” and “lower,” shall be locational terms in reference to a direction of light incident upon a pixel array and/or an image pixel. Unless otherwise specified, light entering shall be considered to interact with or pass objects and/or structures that are “above” and “upper” before interacting with or passing objects and/or structures that are “below” or “lower.” Thus, the locational terms may not have any relationship to the direction of the force of gravity.

Various examples disclosed herein are directed to imaging systems, image sensors, image pixels, and related methods. More particularly, at least some of the examples disclosed herein are directed to image pixels of an image sensor that are designed and constructed to have a smaller parasitic light sensitivity by focusing the light received by the image pixel away from light-sensitive electrical elements that contribute to the parasitic light sensitivity of the image pixel. At least some examples are directed to the use of a metalens including a plurality of nanostructures configured and patterned within a dielectric layer. Light may be focused by the metalens in areas where the phases of wavelengths of refracted light from different nanostructures align and therefore constructively interfere with each other. By utilizing constructive interference, the metalens may focus the light in either a symmetric manner, or in an asymmetric manner, as needed to focus the light away from light-sensitive electrical elements of the image pixel.

Figure 1:
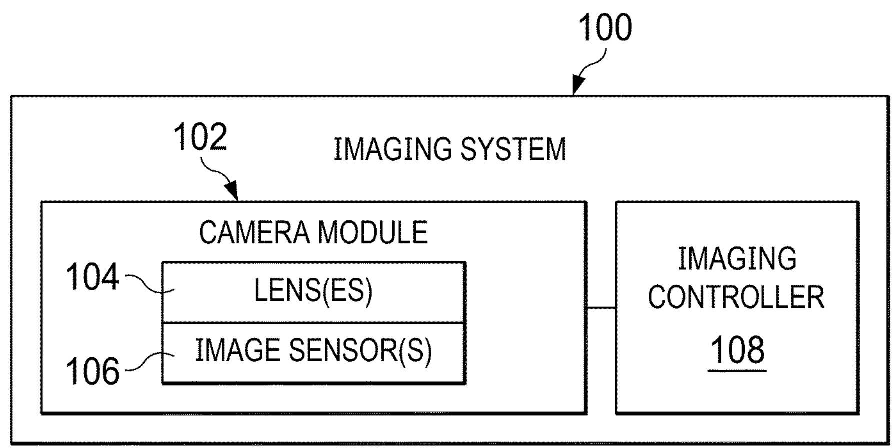
FIG. 1 illustrates a block diagram of an imaging system in accordance with embodiments of the present disclosure.

FIG. 1 illustrates a block diagram of imaging system 100 in accordance with embodiments of the present disclosure. In some embodiments, the example imaging system 100 may be a portable electronic device such as a camera, a cellular telephone, a tablet computer, a webcam, a video camera, a video surveillance system, or a video gaming system with imaging capabilities. In further embodiments, imaging system 100 may be an automotive imaging system. Camera module 102 may be used to convert incoming light into digital image data. Camera module 102 may include one or more lens systems, also referred to herein as lens 104 or lenses 104, and one or more corresponding image sensors 106. Lenses 104 may include one or more fixed lenses, one or more adjustable lenses, or a combination of one or more fixed and one or more adjustable lenses. During image capture operations, light from a scene may be focused onto image sensor 106 by lenses 104. In the case of adjustable lenses, various focus parameters may be adjustable by camera module 102 and/or by imaging controller 108. Image sensor 106 may be communicatively coupled to imaging controller 108 and may comprise circuitry for converting analog pixel data into corresponding digital image data to be provided to the imaging controller 108. In some embodiments, camera module 102 may be provided with an array of lenses 104 and an array of corresponding image sensors 106.

Imaging controller 108 may include one or more integrated circuits, such as image processing circuits, microprocessors, and storage devices such as random-access memory and non-volatile memory. Imaging controller 108 may be implemented using components that are separate from camera module 102 or that form part of camera module 102, such as circuits that form part of image sensor 106. Digital image data captured by camera module 102 may be processed and stored using imaging controller 108. Processed image data may be provided to external equipment, such as a computer, an external display, or other devices, using wired or wireless communications paths, or a combination thereof, coupled to imaging controller 108.

Figure 2:
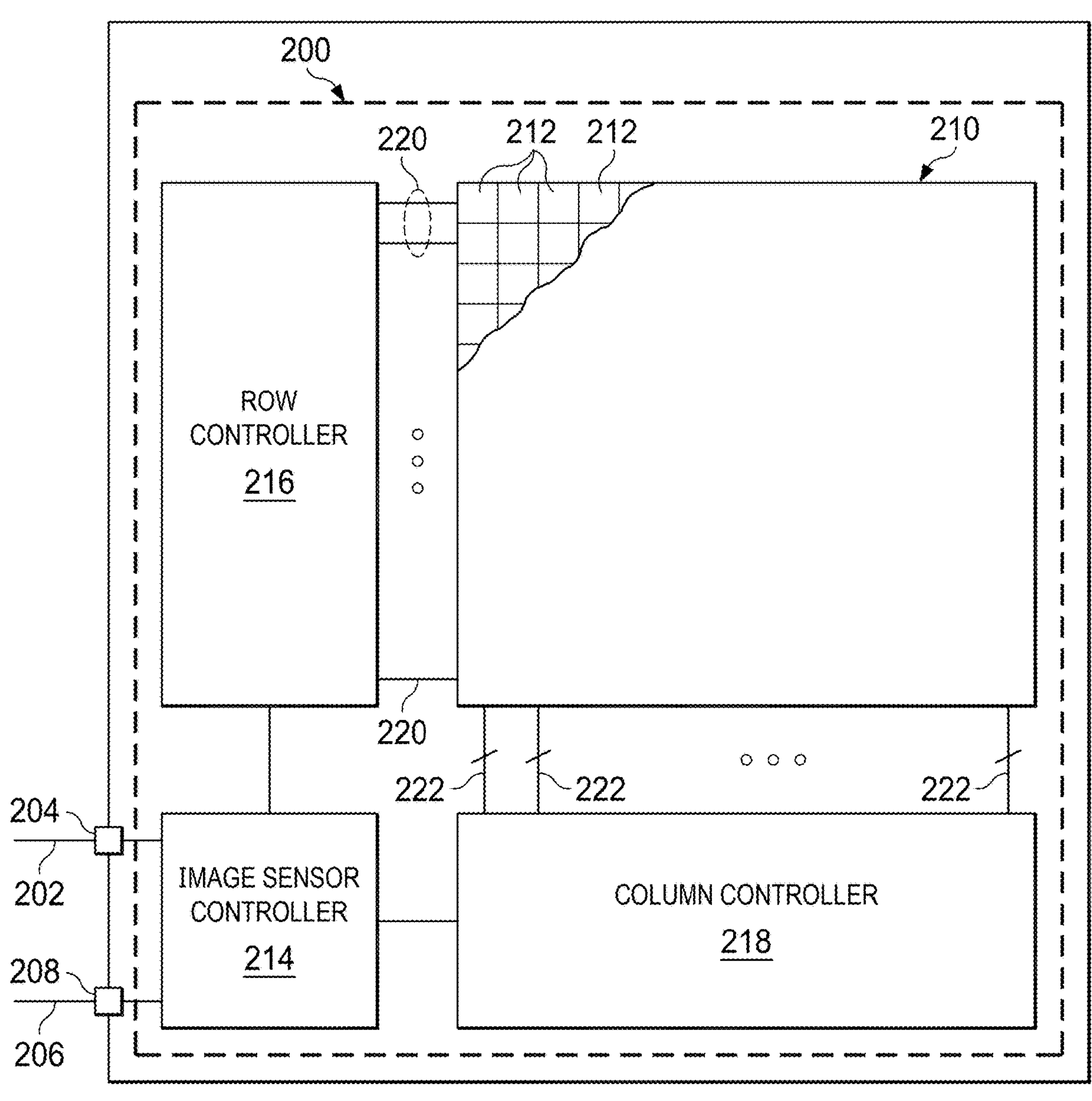
FIG. 2 illustrates a block diagram of an example image sensor in accordance with embodiments of the present disclosure.

FIG. 2 illustrates a block diagram of image sensor 106 in accordance with embodiments of the present disclosure. As shown in FIG. 2, image sensor 106 may in some embodiments comprise a substrate 200 of semiconductor material, such as silicon, encapsulated within packaging to create a packaged semiconductor device or packaged semiconductor product. Bond pads or other connection points of substrate 200 may couple to terminals of image sensor 106, such as a serial communication channel 202 coupled to terminal(s) 204, and capture input 206 coupled to terminal 208. Additional terminals may be present, such as a power terminal and ground or common terminals, but the additional terminals are omitted from FIG. 2 so as not to unduly complicate the figure. Although a single substrate 200 is shown, multiple substrates may be combined in other embodiments to form image sensor 106 as a multi-chip module.

Image sensor 106 may comprise pixel array 210. Pixel array 210 may contain a plurality of image pixels 212 arranged, for example, in rows and columns. In some embodiments, pixel array 210 may comprise hundreds or thousands of rows and columns of image pixels 212. Control and readout of pixel array 210 may be implemented by an image sensor controller 214 coupled to a row controller 216 and a column controller 218. In some embodiments, row controller 216 may receive row addresses from image sensor controller 214 and supply corresponding row control signals to image pixels 212, such as reset, row-select, charge transfer, dual conversion gain, and readout control signals. The row control signals may be communicated over one or more conductors, such as row control paths 220.

Column controller 218 may be coupled to pixel array 210 by way of one or more conductors, such as column lines 222. Column controllers such as column controller 218 may also be referred to as a column control circuit, a readout circuit, and/or column decoder. Column lines 222 may be used for reading out image signals from image pixels 212 and for supplying bias currents and/or bias voltages to image pixels 212. In some embodiments, during pixel readout operations, a pixel row in the pixel array 210 may be selected using row controller 216 and image signals generated by image pixels 212 in that row can be read out along column lines 222. Each image pixel 212 may comprise a plurality of photosensitive regions, such as four, nine, or sixteen, and thus while each column line 222 is shown as a single conductor, a plurality of such column lines may be associated with each image pixel 212 in a column.

In some embodiments, column controller 218 may include sample-and-hold circuitry for sampling and temporarily storing image signals read out from pixel array 210, amplifier circuitry, analog-to-digital conversion (ADC) circuitry, bias circuitry, column memory, latch circuitry for selectively enabling or disabling the column circuitry, or other circuitry that is coupled to one or more columns of pixels in pixel array 210 for operating the image pixels 212 and for reading out image signals from image pixels 212. ADC circuitry in column controller 218 may convert analog pixel values received from the pixel array 210 into corresponding digital image data. Column controller 218 may supply digital image data to the image sensor controller 214 and/or the imaging controller 108 (FIG. 1) over, for example, serial communication channel 202.

Figure 3:
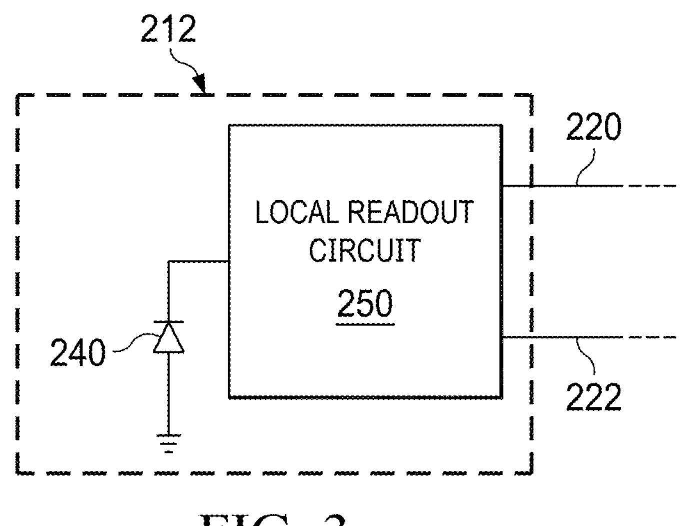
FIG. 3 illustrates a block diagram of exemplary components of an image pixel in accordance with embodiments of the present disclosure.

FIG. 3 illustrates a block diagram of exemplary components of image pixel 212 in accordance with embodiments of the present disclosure. Image pixel 212 may be implemented in any suitable fashion according to the operation described in the present disclosure. In some embodiments, image pixel 212 may include a photosensitive device, such as photodiode 240, as well as additional circuitry such as local readout circuit 250. Photodiode 240 may produce an electrical signal, such as a voltage or a current, responsive to capture or absorption of photons of light. Local readout circuit 250 may read or capture the electrical signal from photodiode 240 and output a signal representative of the amount of light captured or absorbed by photodiode 240.

In some embodiments, local readout circuit 250 of image pixel 212 may communicate with row controller 216 and column controller 218 shown in FIG. 2. For example, local readout circuit 250 of image pixel 212 may communicate with row controller 216 over one or more conductors such as row control path 220. As described above with reference to FIG. 2, row controller 216 may supply a row control signal to image pixel 212, such as a reset, a row-select, a charge transfer, a dual conversion gain, and/or a readout control signal. In addition, local readout circuit 250 may communicate with column controller 218 over one or more conductors, such as column line 222. And as described above with reference to FIG. 2, column lines 222 may be used for reading out image signals from image pixel 212 and for supplying bias currents and/or bias voltages to image pixel 212.

In some embodiments, local readout circuit 250 may support operation of image sensor 106 in a rolling shutter scheme. In a rolling shutter scheme, each row of image pixels 212 may sequentially capture an image. Local readout circuit 250 may also, in some embodiments, support operation of image sensor 106 in a global shutter scheme. In a global shutter scheme, every image pixel 212 in image sensor 106 may simultaneously capture an image.

To support operation of image sensor 106 in a rolling shutter scheme or a global shutter scheme, local readout circuit 250 may include one or more circuit elements to receive control signals directing the timing of image capture, to read or capture an electrical signal from photodiode 240, and to output a signal representative of the amount of light captured or absorbed by photodiode 240. For example, local readout circuit 250 may include one or more n-type metal oxide semiconductor field effect transistors ("n-type MOSFET" or "NMOS transistor") and/or one or more p-type metal oxide semiconductor field effect transistors ("p-type MOSFET" or "PMOS transistor"). In some embodiments, local readout circuit 250 may further include one or more capacitors to integrate the electrical signal received from photodiode 240 and/or to store one or more signals representative of the amount of light captured or absorbed by photodiode 240 prior to communicating the output to column controller 218.

Figure 4A:
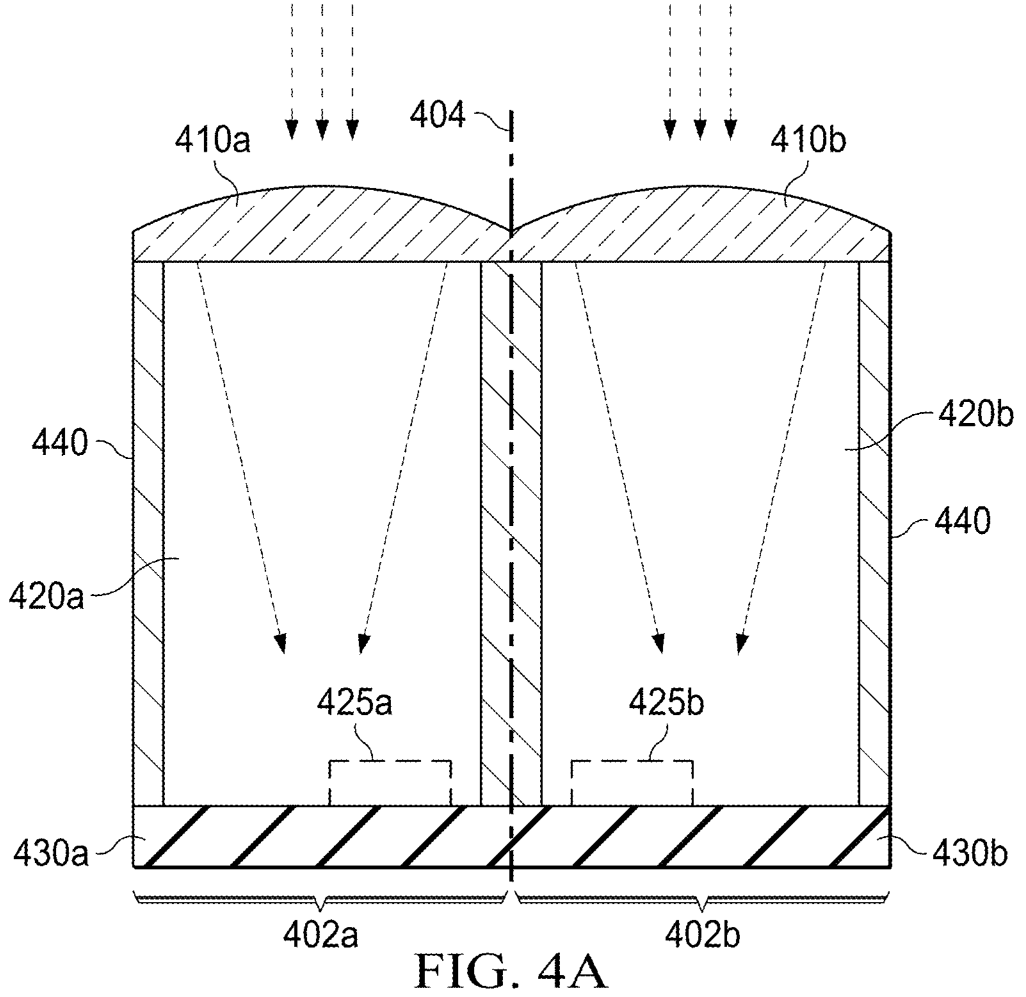
FIGS. 4A-4B illustrate side cross-sectional views of image pixels in accordance with embodiments of the present disclosure.
Figure 4B:
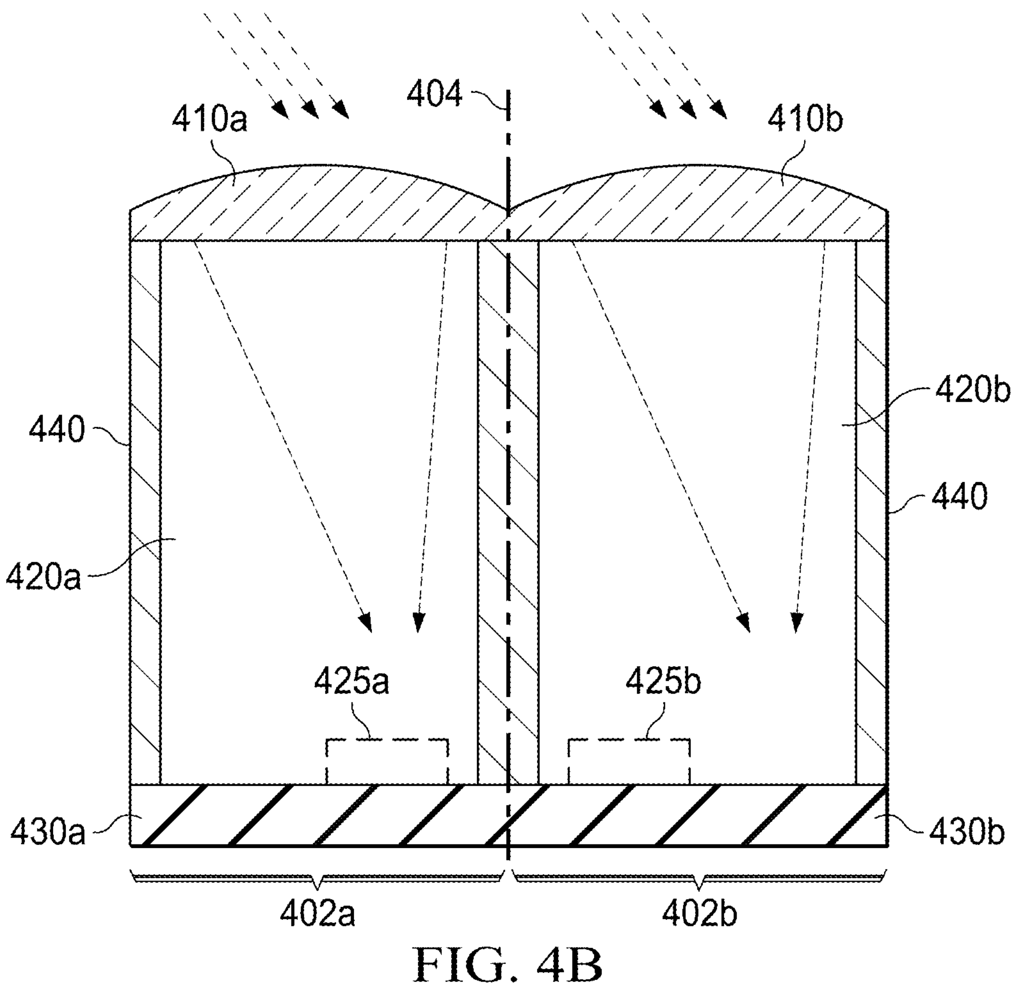

FIGS. 4A-4B illustrate side cross-sectional views of image pixels 402*a* and 402*b* in accordance with embodiments of the present disclosure. Image pixel 402*a* and image pixel 402*b* may represent two image pixels in an image pixel array of an image sensor. The image sensor in which image pixel 402*a* and image pixel 402*b* are implemented may be a backside illuminated (BSI) image sensor with microlenses formed on the back surface of a semiconductor substrate on the opposite side of a photodiode from the dielectric stack that may include one or more dielectric layers and corresponding metal routing layers.

Image pixel 402*a* may include microlens 410*a*, semiconductor region 420*a*, dielectric stack 430*a*, and trench regions 440. Microlens 410*a* may include an organic material, such as an acrylic-based polymer. An upper surface of microlens 410*a* may have a spherical convex shape, and a lower surface of microlens 410*a* may have a planar shape sitting on top of semiconductor region 420*a*. Microlens 410*a* may thus refract the light received at its upper surface and may focus that light into semiconductor region 420*a*.

Semiconductor region 420*a* may include one or more photosensitive devices, such as photodiode 240 described above with reference to FIG. 3. Semiconductor region 420*a* may also include one or more circuit elements that may be used to read or capture an electrical signal from a photosensitive device, such as a photodiode, included within semiconductor region 420*a*. For example, semiconductor region 420*a* may include the active areas of one or more NMOS transistors, PMOS transistors, or metal-oxide semiconductor (MOS)-based capacitors that may form, for example, the circuitry of local readout circuit 250 described above with reference to FIG. 3. Dielectric stack 430*a* may be located under semiconductor region 420*a*. Dielectric stack 430*a* may include a dielectric material, such as silicon dioxide. Dielectric stack 430*a* may also include one or more layers of patterned metal and/or polysilicon that may be used for signal routing. The one or more layers of patterned metal and/or polysilicon may also be used to form the gates or other terminals of any NMOS transistors, PMOS transistors, and/or capacitors included within the local readout circuit.

As shown in FIGS. 4A and 4B, semiconductor region 420*a* may include light-sensitive electrical element 425*a*. Light-sensitive electrical element 425*a* may be, for example, an NMOS transistor, a PMOS transistor, or a capacitor of a local readout circuit, such as local readout circuit 250 described above with reference to FIG. 3. Light-sensitive electrical element 425*a* may be electrically separated from a photodiode included within semiconductor region 420*a*. For example, the active semiconductor regions of light-sensitive electrical element 425*a* may be isolated from a photodiode within semiconductor region 420*a* by one or more isolation wells.

Light-sensitive electrical element 425*a* may contribute to the parasitic light sensitivity of image pixel 402*a*. For example, as photons of light pass through microlens 410*a* and enter semiconductor region 420*a*, the majority of photons may be absorbed by the photodiode included within semiconductor region 420*a* and may generate an electrical current through the photodiode. Additionally, some photons may be absorbed by light-sensitive electrical element 425*a* causing a parasitic current through light-sensitive electrical element 425*a*. As described above, light-sensitive electrical element 425*a* may form part of the local readout circuit for image pixel 402*a*. Thus, parasitic current induced in light-sensitive electrical element 425*a* may distort the accuracy of the local readout circuit.

As shown in FIG. 4A, image pixel 402*a* and image pixel 402*b* may be similarly configured with the features of image pixel 402*b* mirroring the features of image pixel 402*a* about pixel border 404. For example, image pixel 402*b* may include microlens 410*b*, semiconductor region 420*b*, and dielectric stack 430*b*, which may be configured in a similar manner and may collectively operate in a similar manner as the respective microlens 410*a*, semiconductor region 420*a*, and dielectric stack 430*a* of image pixel 402*a*. Microlens 410*b* may be formed with the same continuous microlens material as microlens 410*a*. Similarly, dielectric stack 430*a* may be formed with same continuous dielectric material as dielectric stack 430*b*. Likewise, semiconductor region 420*b* may be formed on the same semiconductor substrate as semiconductor region 420*a*. In some embodiments, the semiconductor regions of different image pixels, such as semiconductor regions 420*a* and 420*b* of image pixels 402*a* and 402*b* respectively, may be separated by trench regions 440. Trench regions 440 may isolate the semiconductor regions of neighboring image pixels both electrically and optically, thereby eliminating or reducing crosstalk between neighboring image pixels.

Due to the mirrored configuration of light-sensitive electrical element 425*a* in image pixel 402*a* and light-sensitive electrical element 425*b* in image pixel 402*b*, light-sensitive electrical elements 425*a* and 425*b* may receive the same amount of light when the light is received perpendicularly from the orientation of image pixels 402*a* and 402*b*. Thus, the parasitic currents induced by the absorption of photons of light may be the same or roughly the same for light-sensitive electrical elements 425*a* and 425*b* when light is received perpendicularly from the orientation of image pixels 402*a* and 402*b*. But, as shown in FIG. 4B, light-sensitive electrical element 425*a* and light-sensitive electrical element 425*b* may receive different amounts of light when image pixels 402*a* and 402*b* receive angled light at microlens 410*a* and microlens 410*b* respectively. Accordingly, the parasitic currents induced in light-sensitive electrical element 425*a* and light-sensitive electrical element 425*b* may be different when image pixels 402*a* and 402*b* receive angled light.

The parasitic light sensitivity of various examples of image pixels disclosed herein may be improved by utilizing a metalens to focus light way from light-sensitive electrical elements included within the image pixel. The metalens may be located above the semiconductor region of the image pixel to receive light. In some embodiments, the metalens may have a planar top surface. In other embodiments, the metalens may have a non-planar top surface. The metalens may include a plurality of nanostructures configured and patterned within one or more dielectric layers. Light may be focused by the metalens in areas where light that is diffracted, scattered, and/or refracted from different nanostructures at different locations within the metalens align and therefore constructively interfere with each other. Conversely, light may be diffused or defocused by the metalens in areas where wavelengths light that is diffracted, scattered, and/or refracted from different nanostructures at different locations within the metalens are out of phase with each other and therefore destructively interfere with each other. By utilizing constructive interference, the metalens may focus the light in either a symmetric manner, or in an asymmetric manner, or in any manner as needed to direct the light away from light-sensitive electrical elements of the image pixel. Moreover, the metalens may be configured to transmit light within a band of a desired wavelengths, and to filter out light having wavelengths outside of the pass band.

Figure 5:
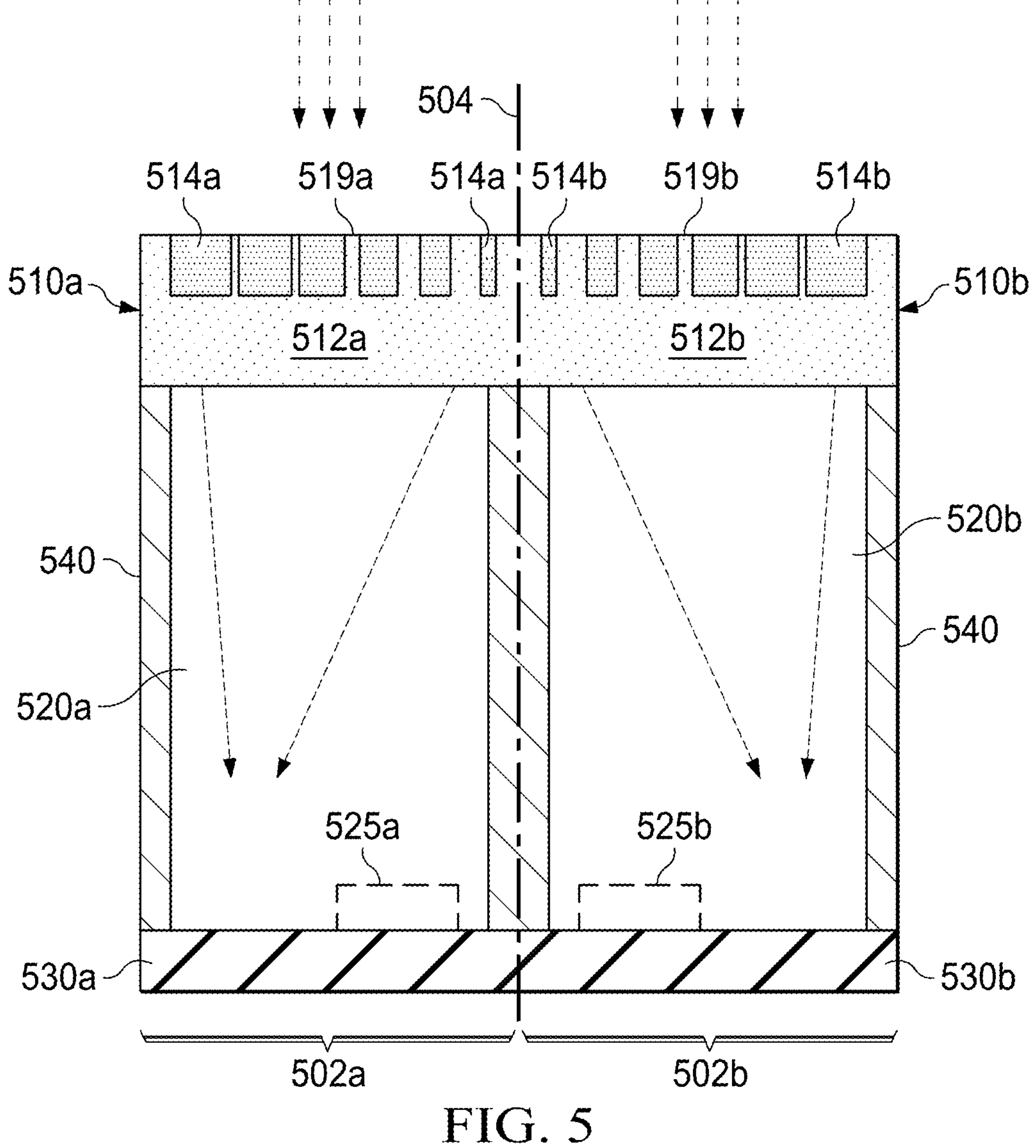
FIG. 5 illustrates a side cross-sectional view of image pixels in accordance with embodiments of the present disclosure.

FIG. 5 illustrates a side cross-sectional view of image pixels 502*a* and 502*b* in accordance with embodiments of the present disclosure. Image pixel 502*a* and image pixel 502*b* may represent two image pixels in an image pixel array of an image sensor. For example, image pixel 502*a* and image pixel 502*b* may represent an embodiment of two image pixels 212 of image sensor 106 described above with reference to FIG. 2. The image sensor in which image pixel 502*a* and image pixel 502*b* are implemented may be a backside illuminated (BSI) image sensor with metalenses formed on the back surface of a semiconductor substrate on the opposite side of a photodiode from the dielectric stack that may include one or more patterned dielectric layers and metallic layers as light routing layers.

Image pixel 502*a* may include metalens 510*a*, semiconductor region 520*a*, dielectric stack 530*a*, and trench regions 540. Semiconductor region 520*a* may include one or more photosensitive devices, such as one or more instances of photodiode 240 described above with reference to FIG. 3. Semiconductor region 520*a* may also include one or more circuit elements that may be used to read or capture an electrical signal from a photosensitive device, such as a photodiode, included within semiconductor region 520*a*. For example, semiconductor region 520*a* may include the active areas of one or more NMOS transistors, PMOS transistors, MOS-based capacitors, or other circuit components that may form, for example, the circuitry of local readout circuit 250 described above with reference to FIG. 3. Dielectric stack 530*a* may be located under semiconductor region 520*a*. Dielectric stack 530*a* may include a dielectric material, such as silicon dioxide. Dielectric stack 530*a* may also include one or more layers of patterned metal and/or polysilicon that may be used for signal routing. The one or more layers of patterned metal and/or polysilicon may also be used to form the gates or other terminals of any NMOS transistors, PMOS transistors, capacitors, or other circuit components included within the local readout circuit of image pixel 502*a*.

As shown in FIG. 5, semiconductor region 520*a* may include light-sensitive electrical element 525*a*. Light-sensitive electrical element 525*a* may be, for example, an NMOS transistor, a PMOS transistor, a capacitor, or another circuit component of a local readout circuit, such as local readout circuit 250 described above with reference to FIG. 3. Light-sensitive electrical element 525*a* may be electrically separated from a photodiode included within semiconductor region 520*a*. For example, one or more active semiconductor regions of light-sensitive electrical element 525*a* may be isolated from a photodiode within semiconductor region 520*a* by one or more isolation wells.

Light-sensitive electrical element 525*a* may contribute to the parasitic light sensitivity of image pixel 502*a*. For example, as photons of light pass through metalens 510*a* and enter semiconductor region 520*a*, the majority of photons may be absorbed by the photodiode included within semiconductor region 520*a* and may generate an electrical current through the photodiode. Any photons absorbed by light-sensitive electrical element 525*a* may cause a parasitic photon-generated current through light-sensitive electrical element 525*a*. As described above, light-sensitive electrical element 525*a* may form part of the local readout circuit for image pixel 502*a*. Thus, parasitic current induced in light-sensitive electrical element 525*a* may distort the accuracy of the local readout circuit.

To limit or reduce the number of photons absorbed by light-sensitive electrical element 525*a*, image pixel 502*a* may include metalens 510*a*. As described in further detail below, metalens 510*a* may be configured to direct light received by image pixel 502*a* away from light-sensitive electrical element 525*a*. By directing light received by image pixel 502*a*, metalens may, for example, route light received by image pixel 502*a* away from light-sensitive electrical element 525*a* and/or focus light received by image pixel 502*a* in an area separate from the area of light-sensitive electrical element 525*a*. Metalens 510*a* may accordingly reduce the parasitic light sensitivity of image pixel 502*a* and of the image sensor in which image pixel 502*a* is implemented.

Metalens 510*a* may have a planar shape with a planar upper surface 519*a*. Metalens 510*a* may include dielectric layer 512*a* and a plurality of nanostructures 514*a* arranged within dielectric layer 512*a*. The plurality of nanostructures 514*a* may be designed and implemented as three-dimensional structures, such as cuboids, having different sizes and having varying indices of refraction compared to the dielectric material of dielectric layer 512*a*. In some embodiments, the plurality of nanostructures 514*a* may be arranged along the upper surface of dielectric layer 512*a*. In other embodiments, the plurality of nanostructures 514*a* may be arranged in multiple layers within dielectric layer 512*a*. In either such embodiments, metalens 510*a* may also include additional layers of dielectric material above the upper surface of dielectric layer 512*a* and the plurality of nanostructures 514*a*. Each of the plurality of nanostructures 514*a* may have a first refractive index that may be greater than a second refractive index of dielectric layer 512*a*. For example, dielectric layer 512*a* may comprise silicon dioxide. In such embodiments, the plurality of nanostructures 514*a* arranged within dielectric layer 512*a* may comprise one or more of silicon nitride and titanium dioxide, which have a higher refractive index than silicon dioxide.

The plurality of nanostructures 514*a* may be patterned within dielectric layer 512*a* to direct light received by image pixel 502*a* away from light-sensitive electrical element 525*a*. As light passes through metalens 510*a*, the light may be diffracted by the nanostructures 514*a* due to the different refractive indexes of dielectric layer 512*a* and nanostructures 514*a*. Light may be directed by metalens 510*a* to areas where the phases of wavelengths of diffracted light from different nanostructures 514*a* align and therefore constructively interfere with each other. Conversely, light may be diffused and directed away from areas where wavelengths of diffracted light from different nanostructures are out of phase with each other and therefore destructively interfere with each other. For example, as shown in FIG. 5, light may be directed toward areas of semiconductor region 520*a* that lie under more densely dispersed nanostructures 514*a* (slower phase velocity of light) and away from areas of semiconductor region 520*a* that lie under less densely arranged nanostructures 514*a* (faster phase velocity of light).

Based on the arrangement of the plurality of nanostructures 514*a*, various embodiments of metalens 510*a* may direct the light received by image pixel 502*a* in any of multiple desired patterns or shapes. In some embodiments, the plurality of nanostructures 514*a* may be patterned to asymmetrically direct light received by image pixel 502*a*. Based on the arrangement of each of the plurality of nanostructures 514*a*, metalens 510*a* may also be configured to direct the light received by image pixel 502*a* in a focal area having any of a symmetric shape, an asymmetric shape, or an arbitrarily selected shape. Moreover, the plurality of nanostructures 514*a* may be arranged to direct the light received by image pixel 502*a* in multiple different focal areas. As non-exclusive examples, one or more focal areas of metalens 510*a* where light may be focused or routed may have any of multiple desired shapes, such as a circular shape, a triangular shape, a square shape, a ring shape, or any other symmetric or asymmetric shape, based on the arrangement of the plurality of nanostructures 514*a* within metalens 510*a*.

Moreover, the plurality of nanostructures 514*a* may be configured and patterned within dielectric layer 512*a* such that metalens 510*a* transmits light for either a narrow band or a broad band of wavelengths. In some embodiments, the plurality of nanostructures 514*a* may be configured and arranged such that different wavelengths of light diffracted from different nanostructures 514*a* constructively interfere with corresponding respective wavelengths of light diffracted from other nanostructures 514*a*. In such embodiments, a broad band of wavelengths of light, for example wavelengths throughout the visible spectrum, may be passed through metalens 510*a* and directed to one or more focal areas by metalens 510*a*. In other embodiments, the plurality of nanostructures 514*a* may be patterned to transmit light in a first band of wavelengths and to filter out light in a second band of wavelengths. For example, the plurality of nanostructures 514*a* may be configured and arranged such that only a narrow band of wavelengths of light diffracted from different nanostructures 514*a* constructively interfere with corresponding respective wavelengths of light diffracted from other nanostructures 514*a*. In such other embodiments, the plurality of nanostructures 514*a* may be configured and arranged such that wavelengths of light outside of the pass band may destructively interfere. Thus, in such other embodiments, a narrow band of wavelengths of light may be passed through metalens 510*a* and directed to one or more focal areas while wavelengths outside of the pass band may be effectively filtered out.

As shown in FIG. 5, image pixel 502*a* and image pixel 502*b* may be similarly configured with the features of image pixel 502*b* mirroring the features of image pixel 502*a* about pixel border 504. Image pixel 502*b* may include metalens 510*b*, semiconductor region 520*b*, and dielectric stack 530*b*, which may be configured in a similar manner and may collectively operate in a similar manner as the respective metalens 510*a*, semiconductor region 520*a*, and dielectric stack 530*a* of image pixel 502*a*. For example, dielectric stack 530*b* may be formed with same continuous dielectric material as dielectric stack 530*a*. Moreover, semiconductor region 520*b* may be formed on the same semiconductor substrate as semiconductor region 520*a*. In some embodiments, the semiconductor regions of different image pixels, such as semiconductor regions 520*a* and 520*b* of image pixels 502*a* and 502*b* respectively, may be separated by trench regions 540. Trench regions 540 may isolate the semiconductor regions of neighboring image pixels both electrically and optically, thereby eliminating or reducing crosstalk between neighboring image pixels.

Further, metalens 510*b* may be formed in a similar manner as metalens 510*a*, and the features of metalens 510*b* may mirror the features of metalens 510*a* about pixel border 504. For example, metalens 510*b* may have a planar shape with a planar upper surface 519*b*. Metalens 510*b* may include dielectric layer 512*b* and a plurality of nanostructures 514*b* arranged within dielectric layer 512*b*. Dielectric layer 512*b* of image pixel 502*b* may be formed with the same continuous dielectric material, such as silicon dioxide, as dielectric layer 512*a* of image pixel 502*a*. Moreover, the plurality of nanostructures 514*b* of image pixel 502*b* may be arranged and configured in a manner that mirrors the plurality of nanostructures 514*a* of image pixel 502*a* about pixel border 504. As shown in FIG. 5, metalens 510*b* may thus similarly direct light away from light-sensitive electrical element 525*b* in image pixel 502*b* in a similar manner as metalens 510*a* directs light away from light-sensitive electrical element 525*a* in image pixel 502*a*.

Light-sensitive electrical elements 525*a* and 525*b* may contribute to the parasitic light sensitivity of image pixels 502*a* and 502*b*. For example, as photons of light pass through metalens 510*a* and metalens 510*b* and enter semiconductor regions 520*a* and 520*b*, the majority of photons may be absorbed by the photodiodes included within the respective semiconductor regions 520*a* and 520*b*. By directing the light away from light-sensitive electrical elements 525*a* and 525*b*, the number of additional photons absorbed by light-sensitive electrical elements 525*a* and 525*b* may be reduced. Thus, any resulting parasitic currents induced in light-sensitive electrical elements 525*a* and 525*b* may also be reduced. As described above, light-sensitive electrical elements 525*a* and 525*b* may form part of the local readout circuits for their respective image pixels. Therefore, by reducing the parasitic current induced in light-sensitive electrical elements 525*a* and 525*b*, the parasitic light sensitivity of image pixels 502*a* and 502*b* may be improved.

Figure 6A:
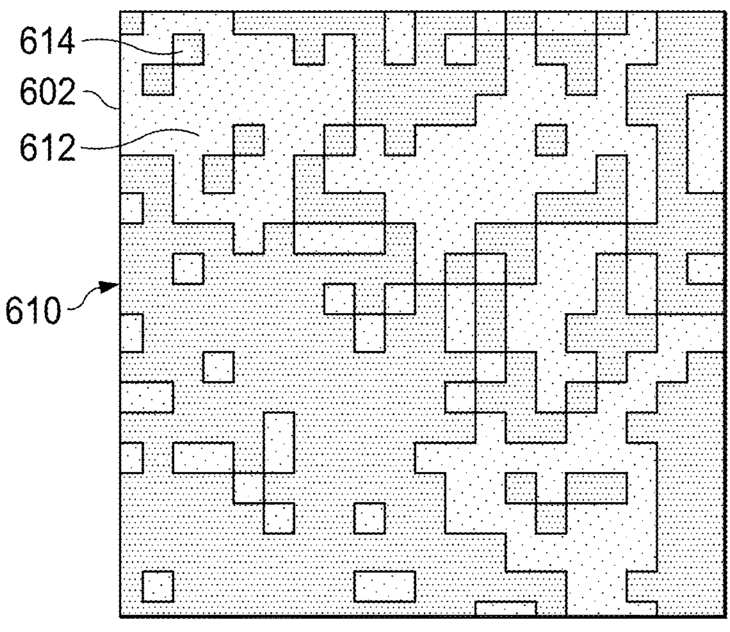
FIG. 6A illustrates a top view of an example metalens in accordance with embodiments of the present disclosure.
Figure 6B:
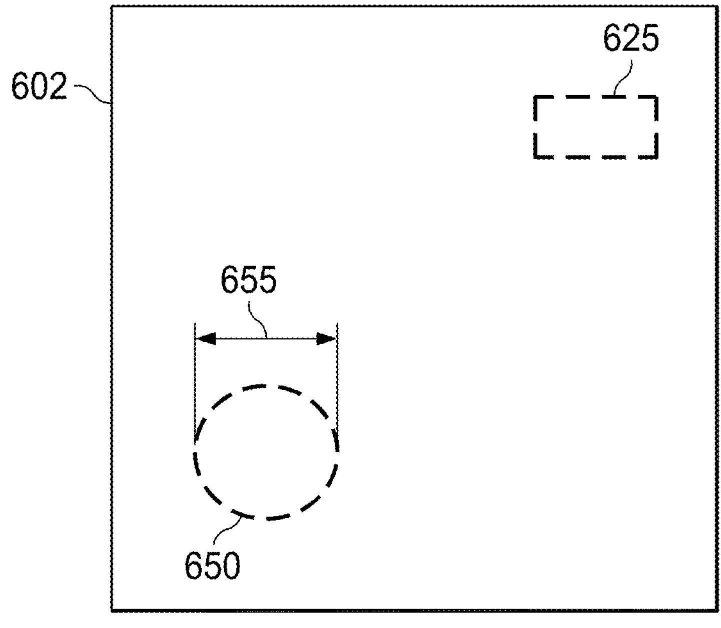
FIG. 6B illustrates a top view of a focal area of an example metalens in accordance with embodiments of the present disclosure.

FIG. 6A illustrates a top view of metalens 610 in accordance with embodiments of the present disclosure. FIG. 6B illustrates a top view of a focal area where light may be focused or routed by metalens 610 in accordance with embodiments of the present disclosure. Metalens 610 may serve as an example embodiment of metalens 510*a* described above with reference to FIG. 5.

Metalens 610 may include a plurality of nanostructures 614 arranged within dielectric layer 612. Each of the plurality of nanostructures 614 may have a first refractive index that may be greater than a second refractive index of dielectric layer 612. For example, dielectric layer 612 may comprise silicon dioxide. In such embodiments, the plurality of nanostructures 614 arranged within dielectric layer 612 may comprise one or more of silicon nitride and titanium dioxide, which have a higher refractive index than silicon dioxide.

As shown in FIG. 6B, image pixel 602 may include light-sensitive electrical element 625. Light-sensitive electrical element 625 may serve as an embodiment of light-sensitive electrical element 525*a* described above with reference to FIG. 5. In some embodiments, the plurality of nanostructures 614 shown in FIG. 6A may be configured and arranged within dielectric layer 612 to direct light away from light-sensitive electrical element 625. For example, the plurality of nanostructures 614 shown in FIG. 6A may focus light having a wavelength of 650 nm in focal area 650 as shown in FIG. 6B. Specifically, the plurality of nanostructures 614 may be arranged such that focal area 650 is located in an area separate from the area of light-sensitive electrical element 625 of image pixel 602.

Due to the patterning of the plurality of nanostructures 614, metalens 610 may asymmetrically direct light away from light-sensitive electrical element 625. Metalens 610 may thus improve the parasitic light sensitivity of image pixel 602, as well as the parasitic light sensitivity of the image sensor in which image pixel 602 is implemented. Moreover, by utilizing constructive interference of diffracted light waves to direct the light, a diameter of a focal area of a primary metalens, such as metalens 610, for a wavelength of light may be less than the wavelength due to near field diffraction effect. For example, by utilizing constructive interference of diffracted light waves to focus the light, the focal area 650 of metalens 610 is not subject to the same diffraction-limited resolution as the focal area of a curved microlens. A diameter 655 of focal area 650 of metalens 610 for a wavelength of light may thus be less than the wavelength of the light. For example, the diameter 655 of focal area 650 for light having a wavelength of 650 nm may be approximately 500 nm. Limiting the diameter of focal area 650 may further aid in keeping focal area 650 spaced away from light-sensitive electrical element 625, thereby improving the parasitic light sensitivity of image pixel 602.

The parasitic light sensitivity of various examples of image pixels disclosed herein may be further improved by utilizing a diffusing layer in combination with a metalens to direct light away from light-sensitive electrical elements included within the image pixel. The diffusing layer and metalens may be located above the semiconductor region of the image pixel. The metalens may be located above the semiconductor region of the image pixel and be configured to direct light away from light-sensitive electrical elements of the image pixel. The diffusing layer may be located above the metalens. The diffusing layer may normalize the angularity of light received by the metalens. More particularly, the diffusing layer may reduce the angularity of the light received by the metalens, relative to an axis perpendicular to the top surface of the metalens, prior to the light passing to and through the metalens. The diffusing layer may also collimate light received across the top surface of the image pixel. Thus, for the purposes of the present disclosure, the diffusing layer may also be referred to as a collimating layer. The metalens and the diffusing layer may operate in conjunction to direct the light received by the image pixel away from light-sensitive electrical elements of the image pixel, regardless of the incident angle at which the light is received. The metalens and the diffusing layer may therefore improve the parasitic light sensitivity of the image pixel, as well as the image sensor in which the image pixel is implemented, across a broad range of angles at which light may be received.

Figure 7:
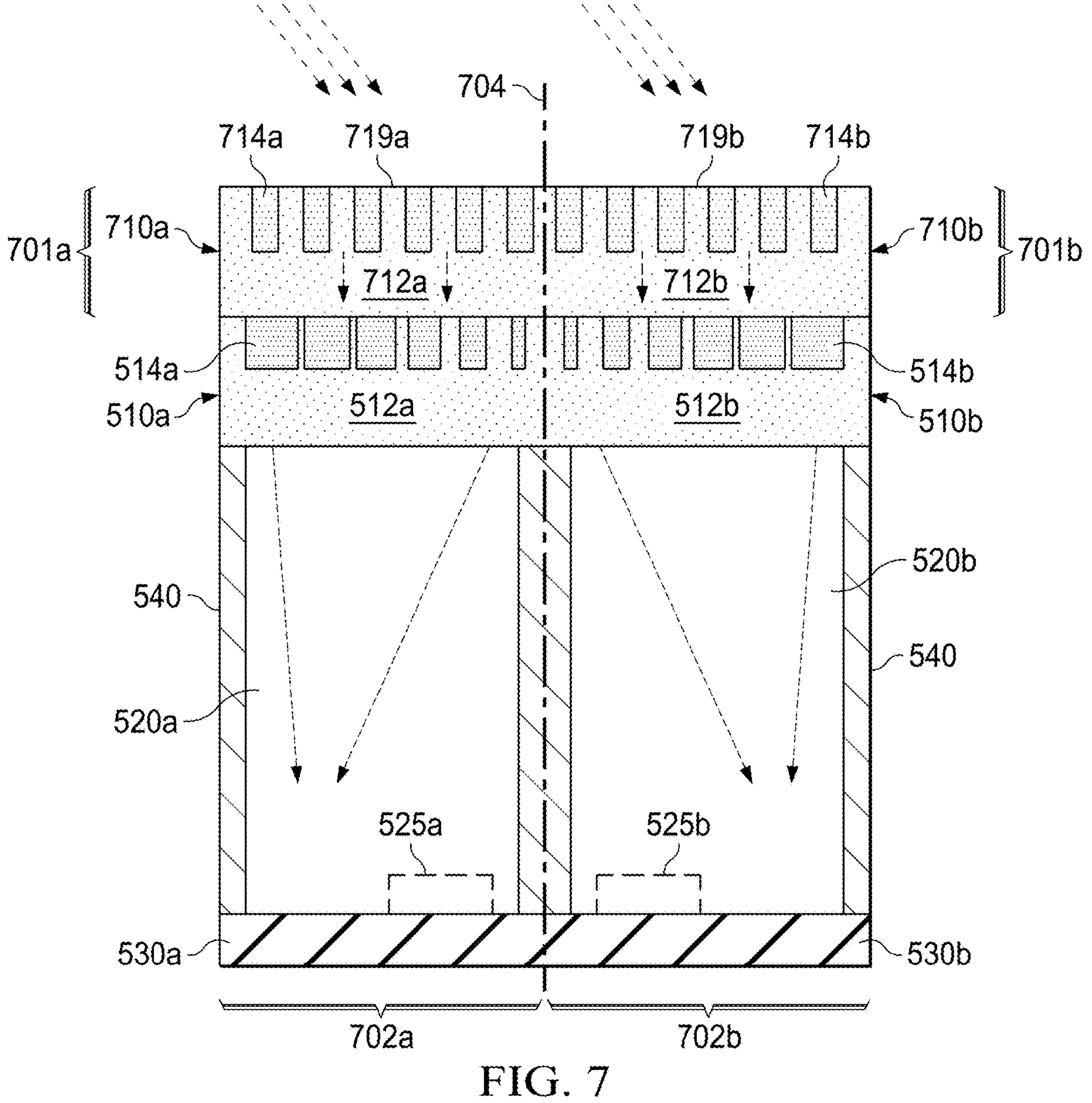
FIG. 7 illustrates a side cross-sectional view of image pixels in accordance with embodiments of the present disclosure.

FIG. 7 illustrates a side cross-sectional view of image pixels 702*a* and 702*b* in accordance with embodiments of the present disclosure. Image pixel 702*a* may be configured in a similar manner as image pixel 502*a* shown in FIG. 5 but may add a diffusing layer 701*a* configured to normalize angled light received by image pixel 702*a*. Likewise, image pixel 702*b* may be configured in a similar manner as image pixel 502*b* shown in FIG. 5, but may add a diffusing layer 701*b* configured to normalize angled light received by image pixel 702*a*. Diffusing layers 701*a* and 701*b* may include any suitable structure to diffuse and normalize angled light received by image pixels 702*a* and 702*b*. For example, as shown in FIG. 7, diffusing layer 701*a* may comprise secondary metalens 710*a*. Likewise, diffusing layer 701*b* may comprise secondary metalens 710*b*. For the purposes of the present disclosure, metalens 510*a* and metalens 510*b* may also be referred to as primary metalens 510*a* and primary metalens 510*b* regardless of whether metalenses 510*a* and 510*b* are included as a single metalens layer or as part of multiple metalens layers, as shown in FIGS. 5 and 7 respectively.

As shown in FIG. 7, diffusing layer 701*a* may be located above primary metalens 510*a*. Thus, in embodiments where diffusing layer 701*a* includes secondary metalens 710*a*, that secondary metalens 710*a* may be located above primary metalens 510*a*. In some embodiments, secondary metalens 710*a* may have a planar shape with a planar upper surface 719*a* as illustrated in FIG. 7. In other embodiments, secondary metalens 710*a* may have a non-planar shape with a non-planar upper surface. Secondary metalens 710*a* may include second dielectric layer 712*a*. Although referred to herein as different dielectric layers, second dielectric layer 712*a* of the secondary metalens 710*a* may, in some embodiments, comprise the same dielectric material, such as silicon dioxide, as dielectric layer 512*a* of the primary metalens 510*a*. In other embodiments, second dielectric layer 712*a* of the secondary metalens 710*a* may comprise a different dielectric material as dielectric layer 512*a* of the primary metalens 510*a*. In yet further embodiments, secondary metalens 710*a* may include a separate material in place of second dielectric layer 712*a*, such as a polymer or air.

Secondary metalens 710*a* may also include a second plurality of nanostructures 714*a* arranged within second dielectric layer 712*a*. In some embodiments, the second plurality of nanostructures 714*a* may be arranged along the upper surface of second dielectric layer 712*a*. In other embodiments, the second plurality of nanostructures 714*a* may be arranged in multiple layers within second dielectric layer 712*a*. In either such embodiments, secondary metalens 710*a* may also include an extended structure with one or more additional layers of dielectric material above the upper surface of second dielectric layer 712*a* and the second plurality of nanostructures 714*a*.

The second plurality of nanostructures 714*a* may be designed and implemented as three-dimensional structures, such as cuboids, having different sizes and having varying indices of refraction compared to the dielectric material of second dielectric layer 712*a*. Each of the second plurality of nanostructures 714*a* may have a refractive index that may be greater than the refractive index of second dielectric layer 712*a*. For example, second dielectric layer 712*a* may comprise silicon dioxide. In such embodiments, the second plurality of nanostructures 714*a* arranged within second dielectric layer 712*a* may comprise one or more of silicon nitride and titanium dioxide, which have a higher refractive index than silicon dioxide. In some embodiments, the second plurality of nanostructures 714*a* of secondary metalens 710*a* may comprise the same nanostructure material as the plurality of nanostructures 514*a* of primary metalens 510*a*. For example, in embodiments where the plurality of nanostructures 514*a* of primary metalens 510*a* are formed with one of silicon nitride and titanium dioxide, the second plurality of nanostructures 714*a* of secondary metalens 710*a* may be formed with the same one of silicon nitride and titanium dioxide. In other embodiments, the second plurality of nanostructures 714*a* of secondary metalens 710*a* may comprise a different nanostructure material than the plurality of nanostructures 514*a* of primary metalens 510*a*. For example, in embodiments where the plurality of nanostructures 514*a* of primary metalens 510*a* are formed with one of silicon nitride and titanium dioxide, the second plurality of nanostructures 714*a* of secondary metalens 710*a* may be formed with the other of silicon nitride and titanium dioxide.

In some embodiments, the second plurality of nanostructures 714*a* may be patterned within second dielectric layer 712*a* to normalize and/or collimate angled light received by image pixel 702*a*. For example, the second plurality of nanostructures 714*a* may be patterned in a manner such that light that is scattered and/or diffracted within secondary metalens 710*a* is diffused and/or collimated, and thus transmitted to primary metalens 510*a* at a lesser angle than received by image pixel 702*a* at the top surface of secondary metalens 710*a*. Specifically, the second plurality of nanostructures 714*a* may be patterned to reduce the angle of the light relative to an axis perpendicular to the top surface of image pixel 702*a*. In such embodiments, secondary metalens 710*a* and primary metalens 510*a* may operate together to direct light received by image pixel 702*a* away from light-sensitive electrical element 525*a* regardless of the angle at which light is received by image pixel 702*a*.

As shown in FIG. 7, image pixel 702*a* and image pixel 702*b* may be similarly configured with the features of image pixel 702*b* mirroring the features of image pixel 702*a* about pixel border 704. Image pixel 702*b* may include primary metalens 510*b*, secondary metalens 710*b*, semiconductor region 520*b*, and dielectric stack 530*b*, which may be configured in a similar manner and may collectively operate in a similar manner as the respective primary metalens 510*a*, secondary metalens 710*a*, semiconductor region 520*a*, and dielectric stack 530*a* of image pixel 702*a*. For example, dielectric stack 530*b* may be formed with same continuous dielectric material as dielectric stack 530*a*. Moreover, semiconductor region 520*b* may be formed on the same semiconductor substrate as semiconductor region 520*a*. In some embodiments, the semiconductor regions of different image pixels, such as semiconductor regions 520*a* and 520*b* of image pixels 702*a* and 702*b* respectively, may be separated by trench regions 540. Trench regions 540 may isolate the semiconductor regions of neighboring image pixels both electrically and optically, thereby eliminating or reducing crosstalk between neighboring image pixels.

In addition, primary metalens 510*b* may be formed in a similar manner as primary metalens 510*a*, the features of primary metalens 510*b* may mirror the features of primary metalens 510*a* about pixel border 704. For example, primary metalens 510*b* may include dielectric layer 512*b* and a plurality of nanostructures 514*b*. The dielectric layer 512*b* of image pixel 502*b* may be formed with the same continuous dielectric material, such as silicon dioxide, as dielectric layer 512*a* of image pixel 502*a*. Moreover, the plurality of nanostructures 514*b* of image pixel 502*b* may be arranged and configured in a manner that mirrors the plurality of nanostructures 514*a* of image pixel 502*a*. Likewise, secondary metalens 710*b* may be formed in a similar manner as secondary metalens 710*a*. For example, secondary metalens 710*b* may have a planar shape with a planar upper surface 719*b*. Further, the features of secondary metalens 710*b* may mirror the features of secondary metalens 710*a* about pixel border 704. For example, secondary metalens 710*b* may include second dielectric layer 712*b* and a second plurality of nanostructures 714*b*. The second dielectric layer 712*b* of image pixel 702*b* may be formed with the same continuous dielectric material, such as silicon dioxide, as second dielectric layer 712*a* of image pixel 702*a*. Moreover, the second plurality of nanostructures 714*b* of image pixel 702*b* may be arranged and configured in a manner that mirrors the second plurality of nanostructures 714*a* of image pixel 702*a*.

As shown in FIG. 7, primary metalens 510*b* and secondary metalens 710*b* of image pixel 702*b* may similarly direct light away from light-sensitive electrical element 525*b* in image pixel 702*b* in a similar manner as primary metalens 510*a* and secondary metalens 710*a* of image pixel 702*a* direct light away from light-sensitive electrical element 525*a* in image pixel 702*a*. Specifically, secondary metalens 710*a* and secondary metalens 710*b* may be patterned to normalize angled light received by image pixels 702*a* and 702*b*. Thus, regardless of the angle at which light may be received by image pixels 702*a* and 702*b*, the light may be normalized as it passes through secondary metalenses 710*a* and 710*b*. The light may then be directed by primary metalenses 510*a* and 510*b* away from the respective light-sensitive electrical elements 525*a* and 525*b* of image pixels 702*a* and 702*b*.

By normalizing the light prior to directing the light away from light-sensitive electrical elements such as light-sensitive electrical elements 525*a* and 525*b*, the parasitic light sensitivity of each individual image pixel may be improved across a range of angles at which light may be received by the image pixels. Moreover, the uniformity of the parasitic light sensitivity across multiple pixels may be improved, thus also improving the parasitic light sensitivity of the image sensor as a whole. For example, as shown in FIG. 7, the components of image pixel 702*b* may be configured to mirror the corresponding components of image pixel 702*a* about pixel border 704. Thus, the orientation of light-sensitive electrical element 525*a* of image pixel 702*a* relative to the angle of the light may be different than for light-sensitive electrical element 525*b* of image pixel 702*b*. But as described above, the angled light may be normalized by secondary metalenses 710*a* and 710*b* prior to being directed away from light-sensitive electrical elements 525*a* and 525*b*. Thus, the improved parasitic light sensitivity for image pixel 702*a* and image pixel 702*b* may remain uniform with each other regardless of the angle at which light is received.

Figure 8:
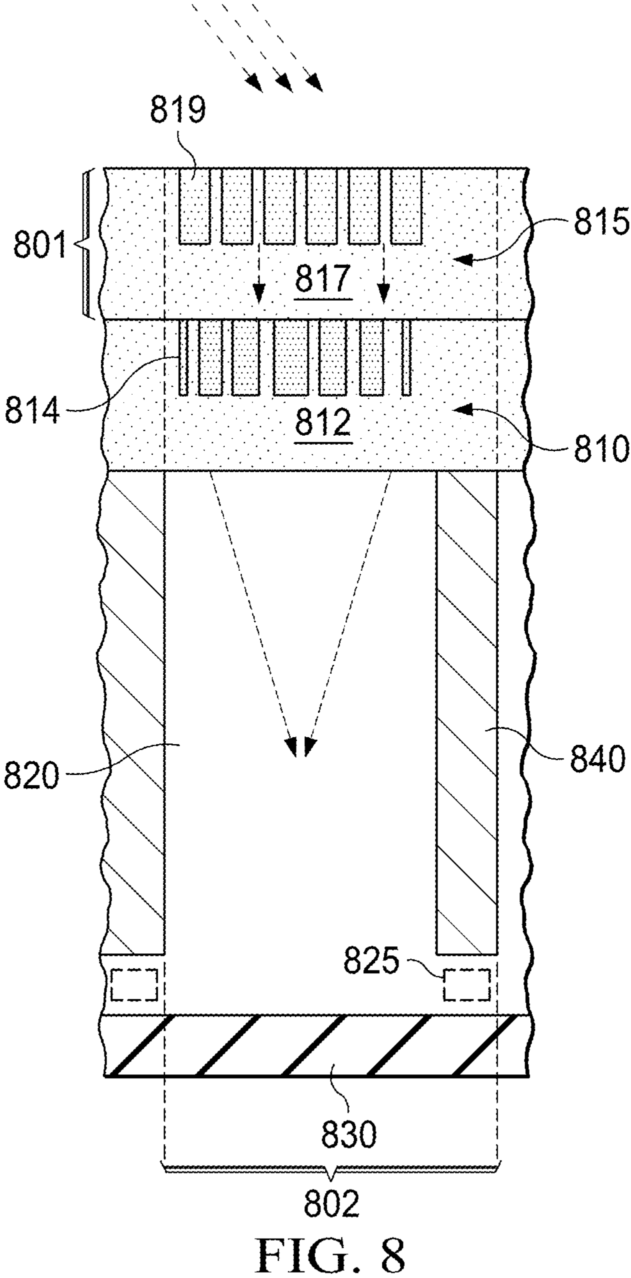
FIG. 8 illustrates a side cross-sectional view of an image pixel in accordance with embodiments of the present disclosure.

FIG. 8 illustrates a side cross-sectional view of image pixel 802 in accordance with embodiments of the present disclosure. Image pixel 802 may represent an image pixel in an image pixel array of an image sensor. For example, image pixel 802 may represent an embodiment of image pixels 212 of image sensor 106 described above with reference to FIG. 2. The image sensor in which image pixel 802 is implemented may be a backside illuminated (BSI) image sensor with a metalens formed on the back surface of a semiconductor substrate on the opposite side of a photodiode from the dielectric stack that may include one or more patterned dielectric layers and metallic layers as light routing layers.

Image pixel 802 may include semiconductor region 820, dielectric stack 830, and trench region 840. Semiconductor region 820 may include one or more photosensitive devices, such as one or more instances of photodiode 240 described above with reference to FIG. 3. Semiconductor region 820 may also include one or more circuit elements that may be used to read or capture an electrical signal from a photosensitive device, such as a photodiode, included within semiconductor region 820. For example, semiconductor region 820 may include the active areas of one or more NMOS transistors, PMOS transistors, MOS-based capacitors, or other circuit components that may form, for example, the circuitry of local readout circuit 250 described above with reference to FIG. 3. Dielectric stack 830 may be located under semiconductor region 820. Dielectric stack 830 may include a dielectric material, such as silicon dioxide. Dielectric stack 830 may also include one or more layers of patterned metal and/or polysilicon that may be used for signal routing. The one or more layers of patterned metal and/or polysilicon may also be used to form the gates or other terminals of any NMOS transistors, PMOS transistors, capacitors, or other circuit components included within the local readout circuit of image pixel 802.

As shown in FIG. 8, further instances of image pixel 802 may be repeated to the right and to the left. Thus, semiconductor region 820 may be at least partially surrounded by a trench region 840 belonging to image pixel 802 and/or a neighboring instance of image pixel 802. Trench regions 840 may isolate the semiconductor regions of neighboring image pixels both electrically and optically, thereby eliminating or reducing crosstalk between neighboring image pixels.

As shown in FIG. 8, light-sensitive electrical element 825 may be located under trench region 840 and to the side of semiconductor region 820. Light-sensitive electrical element 825 may include any of, for example, an NMOS transistor, a PMOS transistor, a capacitor, or another circuit component of a local readout circuit, such as local readout circuit 250 described above with reference to FIG. 3. As an example, in embodiments where image pixel 802 is implemented in a global shutter image sensor, light-sensitive electrical element 825 may include one or more elements of a charge storage circuit. Light-sensitive electrical element 825 may be electrically separated from a photodiode included within semiconductor region 820. For example, one or more active semiconductor regions of light-sensitive electrical element 825 may be isolated from a photodiode within semiconductor region 820 by one or more isolation wells. Light-sensitive electrical element 825 may however contribute to the parasitic light sensitivity of image pixel 802. Although the majority of light received by image pixel 802 may be absorbed in semiconductor region 820, some portion of light received by image pixel 802 may reach light-sensitive electrical element 825 through diffraction and scattering or through reflection from dielectric stack 830. Any resulting photon induced current in light-sensitive electrical element 825 may thus contribute to the parasitic light sensitivity of image pixel 802.

To reduce the parasitic light sensitivity, image pixel 802 may further include diffusing layer 801 and metalens 810. Diffusing layer 801 may be located above metalens 810 and may include any suitable structure to diffuse and normalize angled light received by image pixel 802. As described in further detail below, metalens 810 and the diffusing layer 801 may operate in conjunction to direct the light received by the image pixel away from light-sensitive electrical elements of the image pixel, regardless of the incident angle at which the light is received. As shown in FIG. 8, diffusing layer 801 may in some embodiments include secondary metalens 815. For the purposes of the present disclosure, metalens 810 may also be referred to as primary metalens 810 regardless of whether primary metalens 810 is included as a single metalens layer or is included with secondary metalens 815 as part of multiple metalens layers, as shown in FIG. 8.

Primary metalens 810 may be configured to operate in a similar manner as primary metalens 510*a* described above with reference to FIG. 5. For example, primary metalens 810 may include dielectric layer 812 and a plurality of nanostructures 814 arranged within dielectric layer 812. The plurality of nanostructures 814 may be designed and implemented as three-dimensional structures, such as cuboids, having different sizes and having varying indices of refraction compared to the dielectric material of dielectric layer 812. In some embodiments, the plurality of nanostructures 814 may be arranged along the upper surface of dielectric layer 812. In other embodiments, the plurality of nanostructures 814 may be arranged in multiple layers within dielectric layer 812. In either such embodiments, primary metalens 810 may also include additional layers of dielectric material above the upper surface of dielectric layer 812 and the plurality of nanostructures 814. Each of the plurality of nanostructures 814 may have a first refractive index that may be greater than a second refractive index of dielectric layer 812. For example, dielectric layer 812 may comprise silicon dioxide. In such embodiments, the plurality of nanostructures 814 arranged within dielectric layer 812 may comprise one or more of silicon nitride and titanium dioxide, which have a higher refractive index than silicon dioxide.

As light passes through primary metalens 810, the light may be diffracted by the nanostructures 814 due to the different refractive indexes of dielectric layer 812 and nanostructures 814. Light may be directed by primary metalens 810 to areas where the phases of wavelengths of diffracted light from different nanostructures 814 align and therefore constructively interfere with each other. Conversely, light may be diffused and focused away from areas where wavelengths of diffracted light from different nanostructures are out of phase with each other and therefore destructively interfere with each other. The plurality of nanostructures 814 may thus be patterned within dielectric layer 812 to direct light received by image pixel 802 away from light-sensitive electrical element 825. For example, as shown in FIG. 8, the plurality of nanostructures 814 may direct light received by image pixel 802 toward the center of semiconductor region 820 and away from the light-sensitive electrical element 825 image pixel 802 and the light-sensitive electrical element 825 of a neighboring instance of image pixel 802.

As shown in FIG. 8, diffusing layer 801 may be located above primary metalens 810. Thus, in embodiments where diffusing layer 801 includes secondary metalens 815, that secondary metalens 815 may likewise be located above primary metalens 810. Secondary metalens 815 may include second dielectric layer 817. Although referred to herein as different dielectric layers, second dielectric layer 817 of the secondary metalens 815 may, in some embodiments, comprise the same dielectric material, such as silicon dioxide, as dielectric layer 812 of the primary metalens 810. In other embodiments, second dielectric layer 817 of the secondary metalens 815 may comprise a different dielectric material as dielectric layer 812 of the primary metalens 810. In yet further embodiments, secondary metalens 815 may include a separate material in place of second dielectric layer 817, such as a polymer or air.

Secondary metalens 815 may also include a second plurality of nanostructures 819 arranged within second dielectric layer 817. The second plurality of nanostructures 819 may be designed and implemented as three-dimensional structures, such as cuboids, having different sizes and having varying indices of refraction compared to the dielectric material of second dielectric layer 817. Each of the second plurality of nanostructures 819 may have a refractive index that may be greater than the refractive index of second dielectric layer 817. For example, second dielectric layer 817 may comprise silicon dioxide. In such embodiments, the second plurality of nanostructures 819 arranged within second dielectric layer 817 may comprise one or more of silicon nitride and titanium dioxide, which have a higher refractive index than silicon dioxide. In some embodiments, the second plurality of nanostructures 819 of secondary metalens 815 may comprise the same nanostructure material as the plurality of nanostructures 814 of primary metalens 810. For example, in embodiments where the plurality of nanostructures 814 of primary metalens 810 are formed with one of silicon nitride and titanium dioxide, the second plurality of nanostructures 819 of secondary metalens 815 may be formed with the same one of silicon nitride and titanium dioxide. In other embodiments, the second plurality of nanostructures 819 of secondary metalens 815 may comprise a different nanostructure material than the plurality of nanostructures 814 of primary metalens 810. For example, in embodiments where the plurality of nanostructures 814 of primary metalens 810 are formed with one of silicon nitride and titanium dioxide, the second plurality of nanostructures

819 of secondary metalens 815 may be formed with the other of silicon nitride and titanium dioxide.

In some embodiments, the second plurality of nanostructures 819 may be patterned within second dielectric layer 817 to normalize and/or collimate angled light received by image pixel 802. For example, the second plurality of nanostructures 819 may be patterned in a manner such that light that is scattered and/or diffracted within secondary metalens 815 is diffused and/or collimated and thus transmitted to primary metalens 810 at a lesser angle than received by image pixel 802 at the top surface of secondary metalens 815. Specifically, the second plurality of nanostructures 819 may be patterned to reduce the angle of the light relative to an axis perpendicular to the top surface of image pixel 802. In such embodiments, secondary metalens 815 and primary metalens 810 may operate together to direct light received by image pixel 802 away from light-sensitive electrical element 825 regardless of the angle at which light is received by image pixel 802.

Figure 9:
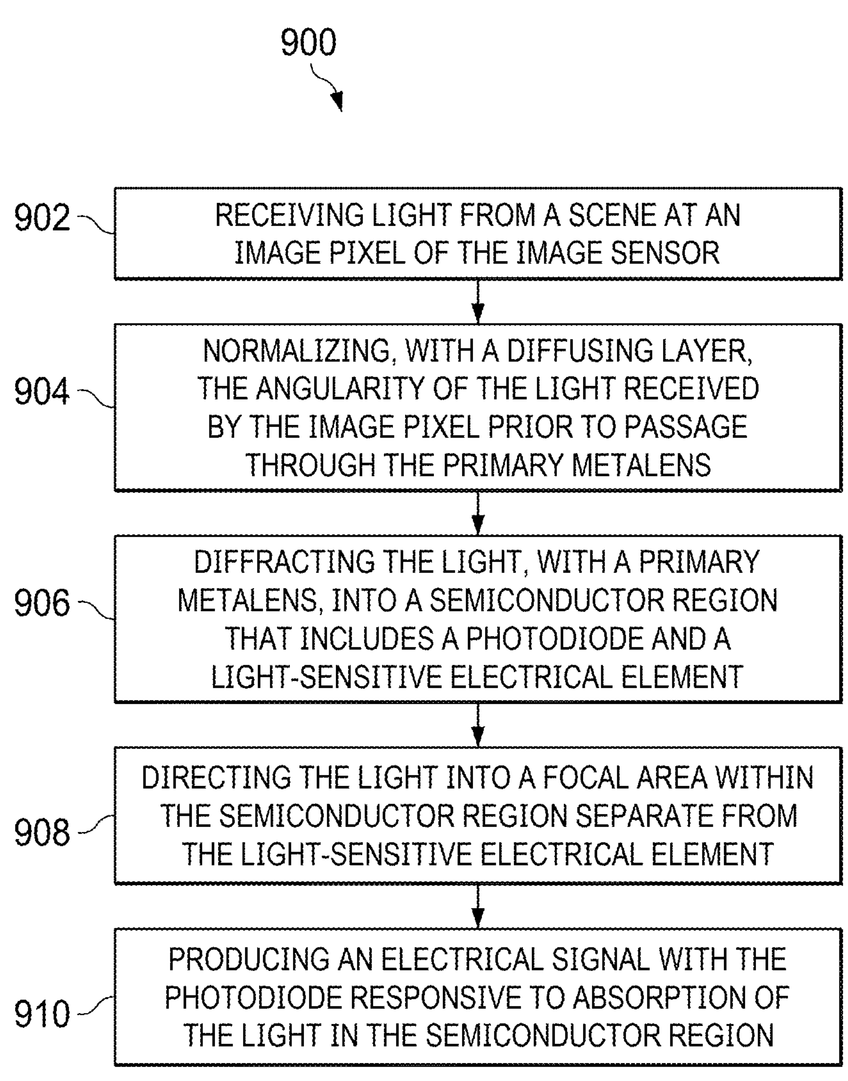
FIG. 9 illustrates a method of operating an image sensor in accordance with embodiments of the present disclosure.

FIG. 9 illustrates method 900 of operating an image sensor in accordance with embodiments of the present disclosure. Method 900 may be performed by any suitable mechanism, such as image sensor 106, image pixel 212, image pixels 502*a* and 502*b*, image pixels 702*a* and 702*b*, image pixel 802, or any suitable combination thereof.

Step 902 may include receiving light from a scene at an image pixel of the image sensor. For example, as described above with reference to FIG. 5, light may be received at image pixel 502*a*. As another example, and as described above with reference to FIG. 7, light may be received at image pixel 702*a*.

Step 904 may include normalizing, with a diffusing layer, the angularity of the light received by the image pixel prior to passage through the primary metalens. For example, as described above with reference to FIG. 7, diffusing layer 701*a* may reduce the angularity of light received by image pixel 702*a* prior to the light passing to and through primary metalens 510*a*. In some embodiments, diffusing layer 701*a* may include secondary metalens 710*a*. The second plurality of nanostructures 714*a* within secondary metalens 710*a* may be patterned in second dielectric layer 712*a* to reduce the angle of the light relative to an axis perpendicular to the top surface of image pixel 702*a*.

Step 906 may include diffracting the light, with a primary metalens, into a semiconductor region that includes a photodiode and a light-sensitive electrical element. For example, as described above with reference to both FIG. 5 and FIG. 7, primary metalens 510*a* may diffract the light into semiconductor region 520*a*, which may include a photodiode such as photodiode 240 as well as light-sensitive electrical element 525*a*.

Step 908 may include directing the light with the primary metalens into a focal area within the semiconductor region that is separate from the light-sensitive electrical element. For example, as described above with reference to both FIG. 5 and FIG. 7, primary metalens 510*a* may asymmetrically direct the light into a focal area away from and separate from the area of light-sensitive electrical element 525*a*. As also described above with reference to FIG. 5, primary metalens 510*a* may direct light in a first band of wavelengths and filter out light in a second band of wavelengths. Specifically, the plurality of nanostructures 514*a* may be patterned within dielectric layer 512*a* of primary metalens 510*a* for transmitting light in a first band of wavelengths and for filtering out light in a second band of wavelengths.

Step 910 may include producing an electrical signal with the photodiode responsive to absorption of the light in the semiconductor region. For example, as described above with reference to FIG. 5, semiconductor region 520*a* may include a photodiode such as photodiode 240 shown in the circuit block diagram of FIG. 3. The photodiode may produce an electrical signal, such as a voltage or a current, responsive to capture or absorption of photons of light. A local readout circuit of image pixel 502*a*, which may include the light-sensitive electrical element 525*a*, may then read or capture the electrical signal from photodiode and output a signal representative of the amount of light captured or absorbed by photodiode.

Method 900 may be performed with fewer or more steps than shown in FIG. 9. As one example, step 904 may be omitted in some embodiments of method 900. Moreover, steps of method 900 may be omitted, repeated, performed in parallel, performed in a different order than shown in FIG. 9, or performed recursively. One or more steps of method 900, although shown in an order, may be performed at the same time or in a re-ordered manner. As one example, steps 906 and 908 may be performed simultaneously.

Although examples have been described above, other modifications and variations may be made from this disclosure without departing from the spirit and scope of these examples. The above descriptions of various embodiments illustrate the principles of the invention. Numerous variations and modifications will become apparent to those skilled in the art based on the above disclosure. The following claims are intended to embrace all such variations and modifications.

What is claimed is:

1. A image sensor comprising:
a plurality of image pixels, each image pixel comprising:
a semiconductor region including a photodiode and a light-sensitive electrical element; and
a primary metalens comprising:
a dielectric layer; and
a plurality of nanostructures arranged within the dielectric layer, wherein:
each of the plurality of nanostructures has a first refractive index that is greater than a second refractive index of the dielectric layer; and
the plurality of nanostructures is patterned within the dielectric layer to direct light received by the image pixel away from the light-sensitive electrical element.

2. The image sensor of claim 1, wherein:
each image pixel further includes a local readout circuit comprising at least the light-sensitive electrical element; and
the light-sensitive electrical element is one of an NMOS transistor, a PMOS transistor, and a capacitor of the local readout circuit.

3. The image sensor of claim 1, wherein the plurality of nanostructures is patterned to asymmetrically direct light received by the image pixel.

4. The image sensor of claim 1, wherein the plurality of nanostructures is patterned to transmit light in a first band of wavelengths and to filter out light in a second band of wavelengths.

5. The image sensor of claim 1, wherein:
the dielectric layer comprises silicon dioxide; and
each of the plurality of nanostructures arranged within the dielectric layer comprises one of silicon nitride and titanium dioxide.

6. The image sensor of claim 1, wherein a diameter of a focal area of the primary metalens for a wavelength of light is less than the wavelength.

7. The image sensor of claim 1, wherein each image pixel further includes a diffusing layer located above the primary metalens and configured to normalize angled light received by the image pixel.

8. The image sensor of claim 7, wherein the diffusing layer includes a secondary metalens comprising:
a second dielectric layer; and
a second plurality of nanostructures arranged within the second dielectric layer, the second plurality of nanostructures patterned to normalize angled light received by the image pixel.

9. The image sensor of claim 8, wherein:
the second dielectric layer of the secondary metalens comprises a same dielectric material as the dielectric layer of the primary metalens; and
the second plurality of nanostructures of the secondary metalens comprises a same nanostructure material as the plurality of nanostructures of the primary metalens.

10. An imaging system comprising:
an imaging controller; and
a camera module comprising:
a lens system coupled to the imaging controller;
an image sensor communicatively coupled to the imaging controller and comprising a plurality of image pixels, each image pixel the plurality of image pixels comprising:
a semiconductor region including a photodiode and a light-sensitive electrical element; and
a primary metalens comprising:
a dielectric layer; and
a plurality of nanostructures arranged within the dielectric layer, wherein:
each of the plurality of nanostructures has a first refractive index that is greater than a second refractive index of the dielectric layer; and
the plurality of nanostructures is patterned within the dielectric layer to direct light received by the image pixel away from the light-sensitive electrical element.

11. The imaging system of claim 10, wherein the plurality of nanostructures is patterned to asymmetrically direct light received by the image pixel.

12. The imaging system of claim 10, wherein:
the dielectric layer comprises silicon dioxide; and
each of the plurality of nanostructures arranged within the dielectric layer comprises one of silicon nitride and titanium dioxide.

13. The imaging system of claim 10, wherein a diameter of a focal area of the primary metalens for a wavelength of light is less than the wavelength.

14. The imaging system of claim 10, wherein each image pixel further includes a diffusing layer located above the primary metalens and configured to normalize angled light received by the image pixel.

15. The imaging system of claim 14, wherein the diffusing layer includes a secondary metalens comprising:
a second dielectric layer; and
a second plurality of nanostructures arranged within the second dielectric layer, the second plurality of nanostructures patterned to normalize angled light received by the image pixel.

16. The imaging system of claim 15, wherein:
the second dielectric layer of the secondary metalens comprises a same dielectric material as the dielectric layer of the primary metalens; and
the second plurality of nanostructures of the secondary metalens comprises a same nanostructure material as the plurality of nanostructures of the primary metalens.

17. A method of operating an image sensor, the method comprising:
receiving light from a scene at an image pixel of the image sensor;
diffracting the light, with a primary metalens, into a semiconductor region that includes a photodiode and a light-sensitive electrical element, wherein the primary metalens includes a plurality of nanostructures with a first refractive index arranged in a pattern within a dielectric layer with a second refractive index that is less than the first refractive index;
directing the light with the primary metalens, based on the pattern of the plurality of nanostructures within the dielectric layer, into a focal area within the semiconductor region that is separate from the light-sensitive electrical element; and
producing an electrical signal with the photodiode responsive to absorption of the light in the semiconductor region.

18. The method of claim 17, further comprising normalizing, with a diffusing layer, an angularity of the light received by the image pixel prior to passage through the primary metalens.

19. The method of claim 17, wherein the light is asymmetrically directed by the primary metalens.

20. The method of claim 17, wherein directing the light with the primary metalens comprises transmitting a first band of wavelengths of the light and filtering out a second band of wavelengths of the light.

* * * * *